United States Patent
Choi et al.

(10) Patent No.: US 8,258,809 B2
(45) Date of Patent: Sep. 4, 2012

(54) SECURITY CIRCUIT HAVING AN ELECTRICAL FUSE ROM

(75) Inventors: Hyun-Su Choi, Suwon-si (KR); Nak-Woo Sung, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/090,755

(22) Filed: Apr. 20, 2011

(65) Prior Publication Data
US 2011/0199809 A1 Aug. 18, 2011

Related U.S. Application Data

(63) Continuation of application No. 12/387,099, filed on Apr. 28, 2009, now Pat. No. 7,949,136.

(30) Foreign Application Priority Data

Apr. 29, 2008 (KR) .......................... 10-2008-0039835

(51) Int. Cl.
*H03K 19/00* (2006.01)
(52) U.S. Cl. ............... 326/8; 380/44; 380/277; 713/194
(58) Field of Classification Search .. 326/8; 380/44–47, 380/59, 277–286; 713/194
See application file for complete search history.

(56) References Cited

U.S. PATENT DOCUMENTS

| | | | |
|---|---|---|---|
| 4,686,384 A | 8/1987 | Harvey et al. | |
| 4,698,617 A | 10/1987 | Bauer | |
| 5,530,749 A | 6/1996 | Easter et al. | |
| 5,799,080 A | 8/1998 | Padmanabhan et al. | |
| 6,621,425 B2 | 9/2003 | Maeda | |
| 6,653,711 B1 * | 11/2003 | Dhanasekaran et al. | 257/529 |
| 7,165,180 B1 * | 1/2007 | Ducharme | 713/182 |
| 7,795,899 B1 | 9/2010 | Grohoski et al. | |
| 7,818,574 B2 * | 10/2010 | Fayad et al. | 713/175 |
| 7,873,830 B2 * | 1/2011 | Fayad et al. | 713/169 |
| 2002/0024453 A1 | 2/2002 | Maeda | |
| 2003/0052712 A1 * | 3/2003 | Comer | 326/38 |
| 2003/0154384 A1 | 8/2003 | Mueller | |
| 2007/0296403 A1 * | 12/2007 | Mori et al. | 324/158.1 |
| 2009/0067211 A1 * | 3/2009 | Rahman | 365/96 |
| 2009/0267636 A1 | 10/2009 | Choi et al. | |
| 2009/0296933 A1 * | 12/2009 | Akselrod et al. | 380/277 |
| 2010/0183154 A1 | 7/2010 | Graunke | |

FOREIGN PATENT DOCUMENTS

JP 2002-73424 3/2002

OTHER PUBLICATIONS

"Security Circuit Having an Electrical Fuse ROM" Specification, Drawings and Prosecution History, of U.S. Appl. No. 12/387,099, filed Apr. 28, 2009, by Hyun-Su Choi, et al.

* cited by examiner

*Primary Examiner* — Jason M Crawford
(74) *Attorney, Agent, or Firm* — Onello & Mello, LLP.

(57) ABSTRACT

A security circuit includes an electrical fuse read only memory (ROM) including a plurality of electrical fuse units. The electrical fuse units are arranged to correspond to bit values of an initial security key before the electrical fuse ROM is programmed.

20 Claims, 7 Drawing Sheets

SECURITY CIRCUIT HAVING AN ELECTRICAL FUSE ROM

RELATED APPLICATION

This application is a continuation application of U.S. patent application Ser. No. 12/387,099, filed on Apr. 28, 2009, which claims the benefit of Korean Patent Application number 10-2008-0039835, filed in the Korean Intellectual Property Office on Apr. 29, 2008, the entire contents of which applications are incorporated herein in their entirety by reference.

BACKGROUND

1. Technical Field

Example embodiments relate to a security circuit, and more particularly to a security circuit including an electrical fuse circuit.

2. Description of the Related Art

Semiconductor devices implemented with integrated circuits may include an electrical fuse read only memory (ROM). The electrical fuse ROM may operate as storage for an identifier of a semiconductor memory chip, storage for fail address of a redundancy memory cell array, or storage for a security key.

All of fuse memory cells included in the electrical fuse ROM are formed to have the same bit value "0" or to have the same bit value "1" before the fuse memory cells are programmed (i.e., before electrical fuses in the fuse memory cells are blown or open), and then a security key indicated by a user may be programmed into the fuse memory cells during an electrical die sort (EDS) test process or during a packaging process after the semiconductor device on a wafer is fabricated out.

The conventional method of programming a security key may program the security key into an electrical fuse read only memory (ROM) after an integrated circuit is formed on a wafer. Because the security key has to be programmed after fabrication of semiconductor devices, test time and cost may be increased and manufacturing efficiency may be degraded.

SUMMARY

Example embodiments provide a security circuit including an electrical fuse read only memory (ROM) which is implemented with arranged electrical fuse units based on an initial security key in a design phase of an integrated circuit that includes the security circuit.

Example embodiments provide a method of designing and programming a security circuit that includes a plurality of the electrical fuse units.

In some example embodiments, a security circuit includes an electrical fuse ROM which includes a plurality of electrical fuse units. The electrical fuse units are arranged to correspond to bit values of an initial security key before the electrical fuse ROM is programmed.

The arrangement of the plurality of electrical fuse units may be determined by an electrical fuse ROM compiler during a design phase of an integrated circuit including peripheral circuits and the security circuit. The electrical fuse ROM compiler may arrange the peripheral circuits and the plurality of electrical fuse units.

The electrical fuse ROM may be programmed in response to a changed security key after an integrated circuit including the security circuit is fabricated when the initial security key is required to be changed.

The plurality of electrical fuse units may include first electrical fuse units and second electrical fuse units. Each of the first electrical fuse unit outputs a data bit "0" before the electrical fuse ROM is programmed. Each of the second electrical fuse unit outputs a data bit "1" before the electrical fuse ROM is programmed. The first electrical fuse units and the second electrical fuse units may be arranged to correspond to the bit values of the initial security key.

Each of first electrical fuse units and the second electrical fuse units included in the security circuit may include a bit cell fuse. Each bit cell fuse may be blown in response to a corresponding bit of a changed security key after an integrated circuit including the security circuit is fabricated when the initial security key is required to be changed.

Each electrical fuse unit may include a master fuse, a master fuse blow circuit, a driver, and a bit cell fuse circuit. The master fuse may include a first terminal to which a program enable signal is applied and a second terminal coupled to the master fuse blow circuit. The master fuse blow circuit may be configured to blow the master fuse in response to a master fuse blow enable signal. The driver may generate a fuse blow enable signal in response to an output signal of the master fuse blow circuit. The bit cell fuse circuit may be configured to be programmed in response to the fuse blow enable signal. The master fuse blow circuit may include a metal oxide semiconductor (MOS) transistor, an inverter, and a switch. The MOS transistor may be connected between the second terminal of the master fuse and a ground voltage. The MOS transistor may maintain a voltage level of the second terminal of the master fuse at the ground voltage in response to the master fuse blow enable signal. The inverter may be configured to invert the master fuse blow enable signal. The switch may include a first terminal coupled to the second terminal of the master fuse and a second terminal coupled to the driver. The switch may be configured to connect the second terminal of the master fuse to the driver in response to an output signal of the inverter.

The driver may include a first MOS transistor and a second MOS transistor. The first MOS transistor may include a control terminal to which an output signal of the master fuse blow circuit is applied, a first terminal coupled to a ground voltage, and a second terminal configured to output the fuse blow enable signal. The second MOS transistor may include a control terminal to which a power supply voltage is applied, a first terminal coupled to the ground voltage, and a second terminal coupled to the control terminal of the first MOS transistor. The bit cell fuse circuit may include bit cell fuse that may be blown to program the bit cell fuse circuit.

In some embodiments, the bit cell fuse circuit may include a bit cell including a bit cell fuse and a blow unit. The blow unit may provide a high voltage to the bit cell in response to the fuse blow enable signal to blow the bit cell fuse. For example, the bit cell may include a first resistor, a second resistor, the bit cell fuse, a third resistor, and a sense amplifier. The first resistor may include a first terminal coupled to a power supply voltage and a second terminal coupled to the second resistor. The second resistor may be connected between a ground voltage and the second terminal of the first resistor. The bit cell fuse may be connected between the ground voltage and a first node, and the third resistor may be connected between the first node and the power supply voltage. The sense amplifier may include an inverted terminal coupled to the second terminal of the first resistor and a non-inverted terminal coupled to the first node. The sense amplifier may be configured to amplify a voltage difference between voltages of the inverted terminal and the non-inverted terminal, and output a data bit "0" which corresponds to one bit of the initial security key before the bit cell fuse is blown.

In some embodiments, the bit cell may include the bit cell fuse, a first resistor, a second resistor, a third resistor, and a sense amplifier. The bit cell fuse may include a first terminal coupled to a ground voltage and a second terminal coupled to the first resistor. The first resistor may be connected between a power supply voltage and the second terminal of the bit cell fuse. The second resistor may be connected between the ground voltage and a first node. The third resistor may be connected between the first node and the power supply voltage. The sense amplifier may include an inverted terminal coupled to the second terminal of the bit cell fuse and a non-inverted terminal coupled to the first node. The sense amplifier may be configured to amplify a voltage difference between voltages of the inverted terminal and the non-inverted terminal, and to output a data bit "1" which corresponds to one bit of the initial security key before the bit cell fuse is blown.

In some embodiments, the bit cell includes a first resistor, a second resistor, the bit cell fuse, a third resistor, a sense amplifier, and an inverter. The first resistor may include a first terminal coupled to a power supply voltage. The second resistor may be connected between a power supply voltage and a second terminal of the first resistor. The bit cell fuse may be connected between the ground voltage and a first node. The third resistor may be connected between the first node and the power supply voltage. The sense amplifier may include an inverted terminal coupled to the second terminal of the first resistor and a non-inverted terminal coupled to the first node. The sense amplifier may be configured to amplify a voltage difference between voltages of the inverted terminal and the non-inverted terminal. The inverter may be configured to invert an output signal of the sense amplifier, and to output a data bit "1" which corresponds to one bit of the initial security key before the bit cell fuse is blown.

In some embodiments, the bit cell may include a p-type MOS (PMOS) transistor, the bit cell fuse, a first inverter, and a second inverter. The PMOS transistor may include a control terminal to which data corresponding to a logic state "0" is applied, a first terminal to which a power supply voltage is applied, and a second terminal coupled to a first node. The bit cell fuse may be connected between the first node and a ground voltage. The first inverter may invert a voltage of the first node. The second inverter may invert an output voltage of the first inverter, and to output a data bit "0" which corresponds to one bit of the initial security key before the bit cell fuse is blown.

In some embodiments, the bit cell may include a PMOS transistor, the bit cell fuse, and an inverter. The PMOS transistor may include a control terminal to which data corresponding to a logic state "0" is applied, a first terminal to which a power supply voltage is applied, and a second terminal coupled to a first node. The bit cell fuse may be connected between the first node and a ground voltage. The inverter may be configured to invert a voltage of the first node, and to output a data bit "0" which corresponds to one of the initial security key before the bit cell fuse is blown.

In some embodiments, the blow unit may include an inverter and an n-type MOS (NMOS) transistor. The inverter may invert the fuse blow enable signal. The NMOS transistor may include a control terminal to which an output signal of the inverter is applied, a first terminal coupled to the bit cell fuse, and a second terminal to which the high voltage is applied.

Consequently, the security circuit includes the electrical fuse ROM which is implemented with the plurality of electrical fuse units arranged to correspond to the bit values of the initial security key during the design phase of the integrated circuit. Therefore, the security circuit does not blow the electrical fuse ROM when the initial security key is not changed after the integrated circuit is fabricated. Moreover, when the initial security key is changed after the integrated circuit is fabricated, the security circuit according to some embodiments may program the changed security key by blowing the electrical fuses included in the electrical fuse ROM.

The security circuit may prevent the unwanted change of the initial security key through the package pin by using the master fuse. Therefore, the semiconductor device including the security circuit may reduce test time and cost, and thus the manufacturing efficiency may be improved.

BRIEF DESCRIPTION OF THE DRAWINGS

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE EMBODIMENTS

Figure 1:
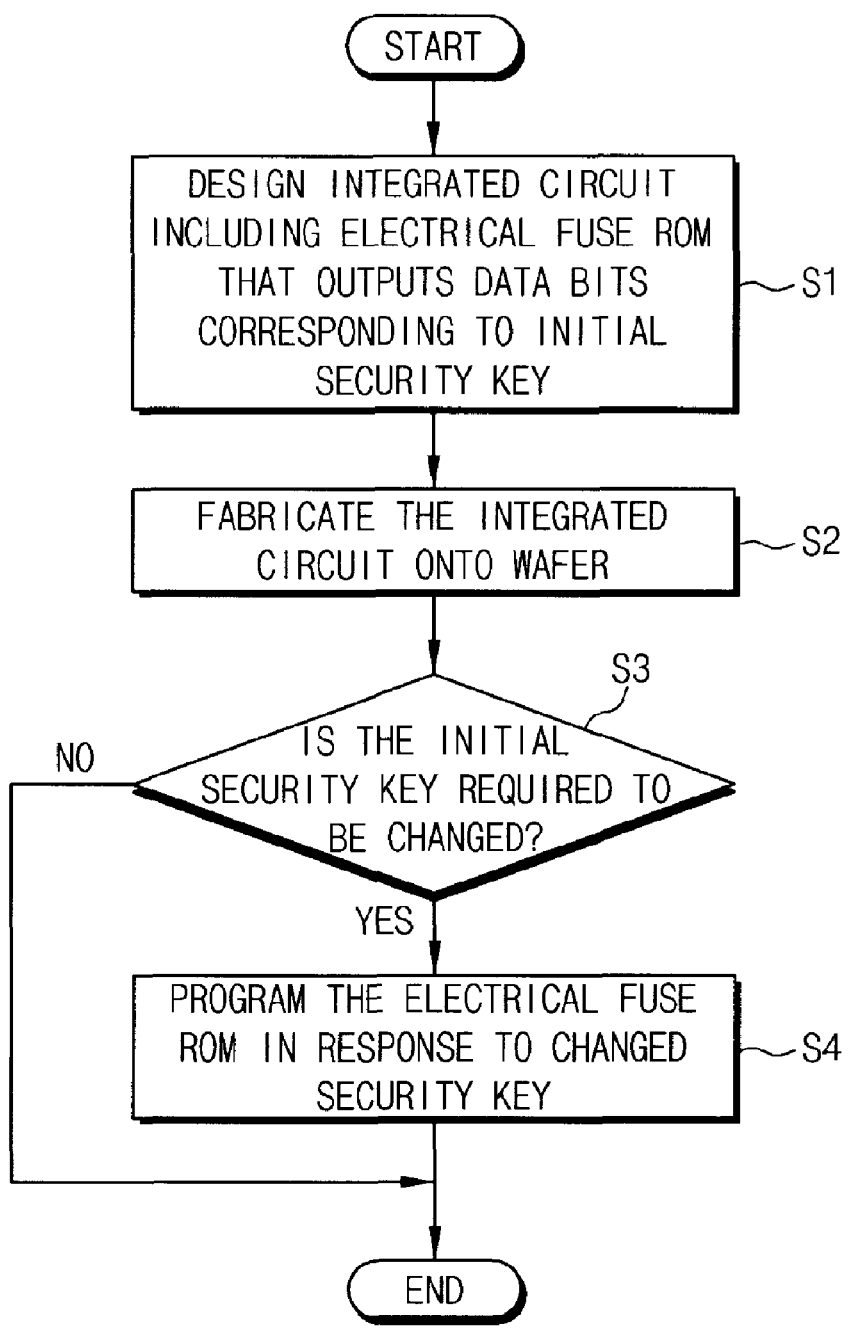
FIGS. 1 and 2 are flow charts illustrating methods of programming a security key using an electrical fuse read only memory (ROM) according to some example embodiments.

This application claims priority under 35 USC §119 to Korean Patent Application No. 2008-0039835, filed on Apr. 29, 2008 in the Korean Intellectual Property Office (KIPO), the disclosure of which is incorporated herein in its entirety by reference.

Embodiments of the present invention now will be described more fully with reference to the accompanying drawings, in which embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a flow chart illustrating a method of programming a security key using an electrical fuse ROM according to some example embodiments.

Referring to FIG. 1, according to a method of programming a security key, an integrated circuit including an electrical fuse ROM that outputs data bits corresponding to an initial security key is designed (Step S1). The integrated circuit is fabricated onto a wafer (Step S2). Whether the initial security key is required to be changed is determined (Step S3). The electrical fuse ROM is programmed in response to a changed security key when the initial security key is required to be changed (Step S4).

According to the method of programming the security key illustrated in FIG. 1, the initial security key may be implemented using the electrical fuse ROM in a design phase differently from the conventional programming method in which the security key is programmed after a fabrication of the integrated circuit. Therefore, electrical fuses included in the electrical fuse ROM are not blown or programmed when the initial security key is not required to be changed after the integrated circuit is fabricated. When the initial security key is required to be changed after the integrated circuit is fabricated, the changed security key may be programmed into the electrical fuse ROM so that electrical fuses are blown.

Figure 2:
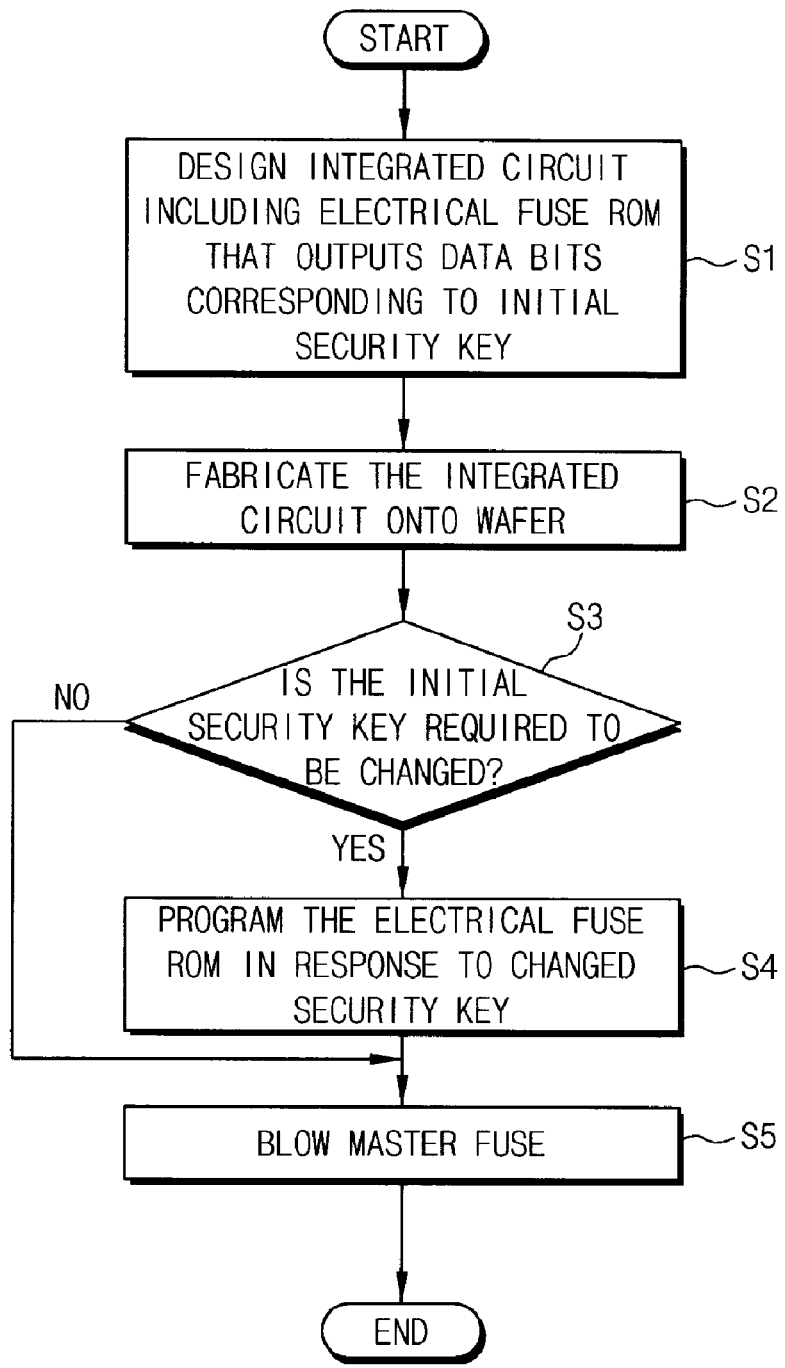

FIG. 2 is a flow chart illustrating a method of programming a security key using the electrical fuse ROM according to some example embodiments.

Referring to FIG. 2, according to a method of programming the security key, an integrated circuit including the electrical fuse ROM that outputs data bits corresponding to an initial security key is designed (Step S1). The integrated circuit is fabricated onto a wafer (Step S2). Whether the initial security key is required to be changed is determined (Step S3). If the initial security key is required to be changed, the electrical fuse ROM is programmed in response to the changed security key (Step S4). The master fuse is blown in Step S5. Referring back to Step S3, if the initial security key is not required to be changed, then the master fuse is blown in Step S5, without programming the electrical fuse ROM in response to a changed security key in Step S4.

Figure 3:
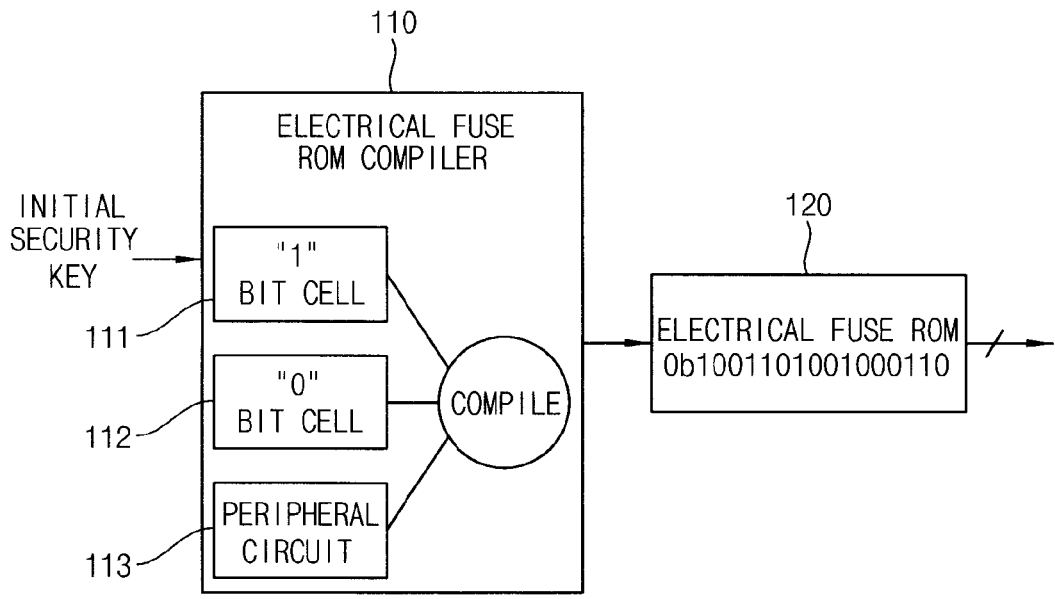
FIG. 3 is a diagram illustrating a process of designing a security circuit according to some example embodiments.

The method of programming the security key illustrated in FIG. 3 may prevent changing of the security key caused by a package pin.

FIG. 3 is a diagram illustrating a process of designing a security circuit according to some example embodiments. Referring to FIG. 3, a security circuit including an electrical fuse ROM 120 and peripheral circuits (not shown) may be designed by an electrical fuse ROM compiler 110.

The electrical fuse ROM compiler 110 selects bit cells included in the electrical fuse ROM 120 based on an initial security key and arranges the selected bit cells so that the selected bit cells forming the electrical fuse ROM 120 may output the initial security key during the design phase of the integrated circuit. The electrical fuse ROM compiler 110 arranges bit cells 111 having a data bit "1" and bit cells 112 having a data bit "0" in response to the initial security key. The electrical fuse ROM compiler 110 selects and arranges peripheral circuits 113 for each bit of the initial security key. Output data of the electrical fuse ROM 120 corresponding to the each bit of the initial security key may be provided to a central processing unit (CPU).

The security circuit including the electrical fuse ROM 120 is designed based on the initial security key during the design phase of the integrated circuit. As mentioned above, the electrical fuse ROM 120 need not to be blown when the initial security key is not required to be changed after the integrated circuit is fabricated. When the initial security key is required to be changed after the integrated circuit is fabricated, the electrical fuse ROM 120 may be programmed according to the refreshed or changed security key. The security circuit according to some example embodiments may prevent the unwanted change of the initial security key through the package pin by using the master fuse. Therefore, a semiconductor test device including the security circuit may not only reduce test time and cost of the integrated circuit but also improve manufacturing efficiency.

Figure 4A:
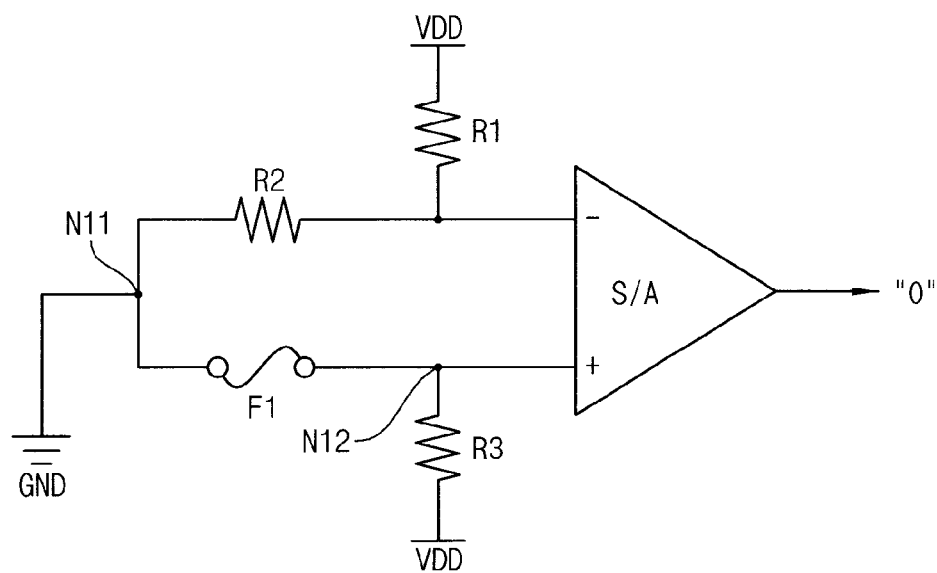
FIGS. 4A to 4C are circuit diagrams illustrating examples of differential electrical fuse cells.
Figure 4B:
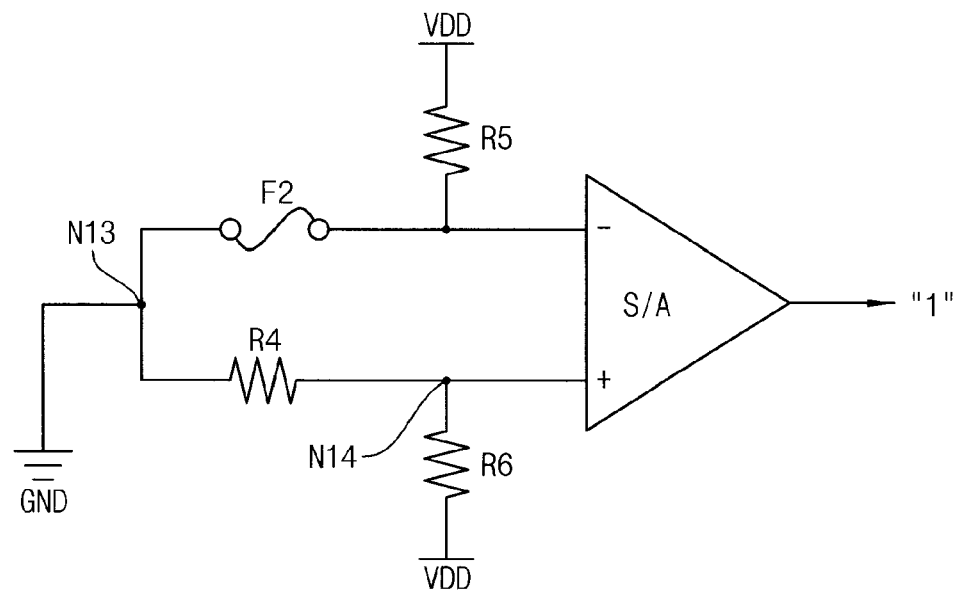
Figure 4C:
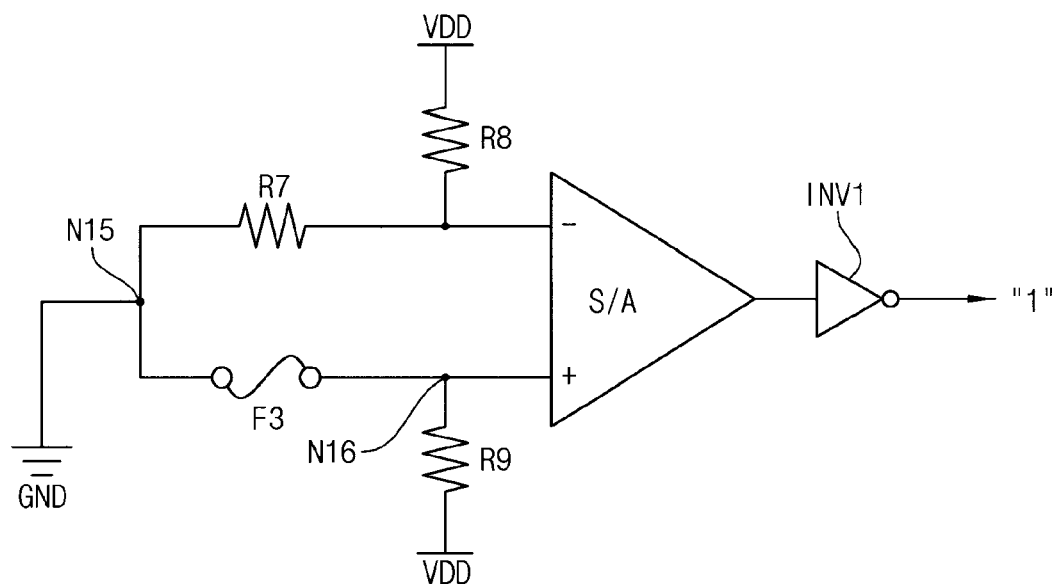

FIGS. 4A to 4C are circuit diagrams illustrating differential electrical fuse cells according to some example embodiments.

Referring to FIG. 4A, a differential electrical fuse cell may include a first resistor R1, a second resistor R2, a bit cell fuse F1, a third resistor R3, and a sense amplifier S/A.

The first resistor R1 includes a first terminal coupled to a power supply voltage VDD, and a second resistor R2 connected between a ground voltage GND and a second terminal of the first resistor R1. A voltage level of a first node N11 is corresponds to the ground voltage GND. The bit cell fuse F1 is connected between the ground voltage GND and a second node N12. The third resistor R3 is connected between the second node N12 and the power supply voltage VDD. The sense amplifier S/A includes an inverted terminal coupled to the second terminal of the first resistor R1, and a non-inverted terminal coupled to the second node N12. The sense amplifier S/A amplifies a voltage difference between a voltage of the inverted terminal and a voltage of the non-inverted terminal, and outputs the data bit "0" which corresponds one bit of the initial security key before the bit cell fuse F1 is blown. When the data bit "0" is required to be changed to the data bit "1" after the integrated circuit is fabricated, the bit cell fuse F1 is blown in response to a corresponding bit of the changed security key.

Referring to FIG. 4B, differential electrical fuse cell may include a bit cell fuse F2, a fourth resistor R4, a fifth resistor R5, a sixth resistor R6, and a sense amplifier S/A.

The bit cell fuse F2 includes a first terminal coupled to the ground voltage GND, and the fifth resistor R5 is connected between the power supply voltage VDD and a second terminal of the bit cell fuse F2. A voltage of a third node N13 corresponds to the ground voltage GND. The fourth resistor R4 is connected between the ground voltage GND and a fourth node N14, and a sixth resistor R6 is connected between the fourth node N14 and the power supply voltage VDD. The sense amplifier S/A includes an inverted terminal coupled to the second terminal of the bit cell fuse F2 and a non-inverted terminal coupled to the fourth node N14. The sense amplifier S/A amplifies a voltage difference between voltages of the inverted terminal and the non-inverted terminal, and outputs the data bit "0" which corresponds to one bit of the initial security key before the bit cell fuse F2 is blown. When the corresponding bit of the initial security key is required to be changed to the data bit "1", the bit cell fuse F2 is blown in response to a corresponding bit of the changed security key.

Referring to FIG. 4C, a differential electrical fuse cell may include a seventh resistor R7, an eighth resistor R8, a bit cell fuse F3, a sense amplifier S/A, and a first inverter INV1.

The seventh resistor R7 includes a first terminal coupled to the ground voltage GND, and the eighth resistor R8 is connected between the power supply voltage VDD and a second terminal of the seventh resistor R7. A voltage of a fifth node N15 corresponds to the ground voltage GND. The bit cell fuse F3 is connected between the ground voltage GND and a sixth node N16. The ninth resistor R9 is connected between the sixth node N16 and the power supply voltage VDD. The sense amplifier S/A includes an inverted terminal coupled to the second terminal of the seventh resistor R7 and a non-inverted terminal coupled to the sixth node N16. The sense amplifier S/A amplifies a voltage difference between voltages of the inverted terminal and the non-inverted terminal, and outputs the data bit "1" which corresponds one bit of the initial security key before the bit cell fuse F3 is blown. When the initial security key is required to be changed after the differential electrical fuse cell of FIG. 4C is fabricated out, the bit cell fuse F3 is blown in response to a corresponding bit of the changed security key. The first inverter INV1 inverts the output of the sense amplifier S/A.

Hereinafter, operations of differential electrical fuse cells according to example embodiments will be described with reference to FIGS. 4A to 4C.

The differential electrical fuse cells illustrated in FIGS. 4A to 4C output the data bit "0", or the data bit "1" according to the voltage difference between the voltages of the inverted terminal and the non-inverted terminal of the sense amplifier S/A.

For example, when the bit cell fuse F1 is not blown, the voltage of the inverted terminal is greater than the voltage of the non-inverted terminal, and thus the differential electrical fuse cell of FIG. 4A outputs the data bit "0". When the bit cell fuse F1 is blown, that is the initial security key is required to be changed after the integrated circuit including the differential electrical fuse cell of FIG. 4A is fabricated, the voltage of the inverted terminal is smaller than the voltage of the non-inverted terminal, and thus the differential electrical fuse cell of FIG. 4A outputs the data bit "1".

With reference to FIG. 4B, when the bit cell fuse F2 is not blown, the voltage of the inverted terminal is smaller than the voltage of the non-inverted terminal, and thus the sense amplifier S/A outputs the data bit "1". When the bit cell fuse F2 is blown, the voltage of the inverted terminal is greater than the voltage of the non-inverted terminal, and thus the sense amplifier S/A outputs the data bit "0".

With reference to FIG. 4C, when the bit cell fuse F3 is not blown, the voltage of the inverted terminal is greater than the voltage of the non-inverted terminal, and thus an output signal of the sense amplifier S/A corresponds to the logic state "low" so that the differential electrical fuse cell outputs the data bit "1". When the bit cell fuse F3 is blown, the voltage of the inverted terminal is smaller than the voltage of the non-inverted terminal, and thus the output signal of the sense amplifier S/A corresponds to the logic state "high" so that the differential electrical fuse cell outputs the data bit "0".

The differential electrical fuse cell of FIG. 4A outputs the data bit "0" when the bit cell fuse in FIG. 4A is not blown. The differential electrical fuse cells of FIGS. 4B and 4C output data bit "1" when the bit cell fuses in FIGS. 4B and 4C is not blown. The security circuit may be selectively implemented with the differential electrical fuse cells of FIGS. 4A to 4C by the arrangement of the electrical fuse ROM compiler 110 in FIG. 3. Each of the differential electrical fuse cells outputs a predetermined data bit "0" or "1" based on the corresponding bit of the initial security key during the design phase of the integrated circuit. However, when the initial security key is required to be changed after the fabrication, the bit cell fuses in FIGS. 4A to 4C are blown, and thus output data bit values may be changed in response to the changed security key.

Figure 5A:
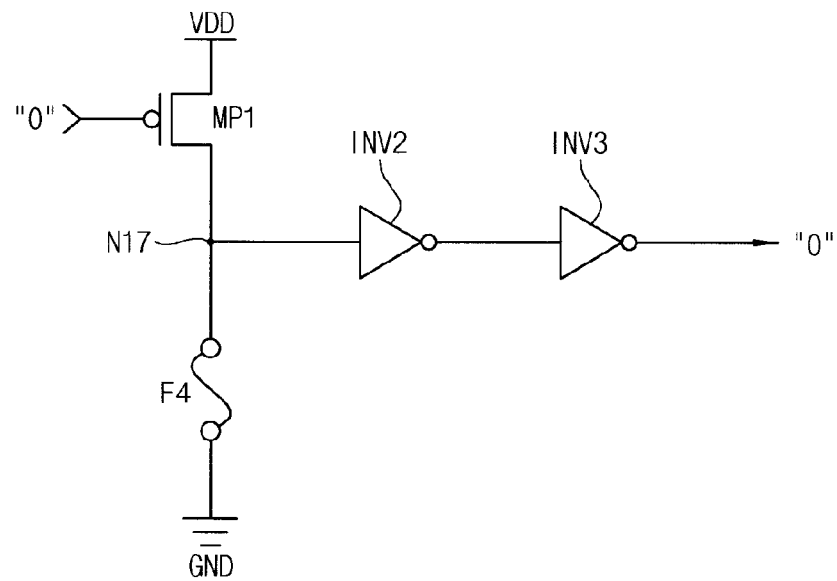
FIGS. 5A and 5B are circuit diagrams illustrating examples of single-ended electrical fuse cells.
Figure 5B:
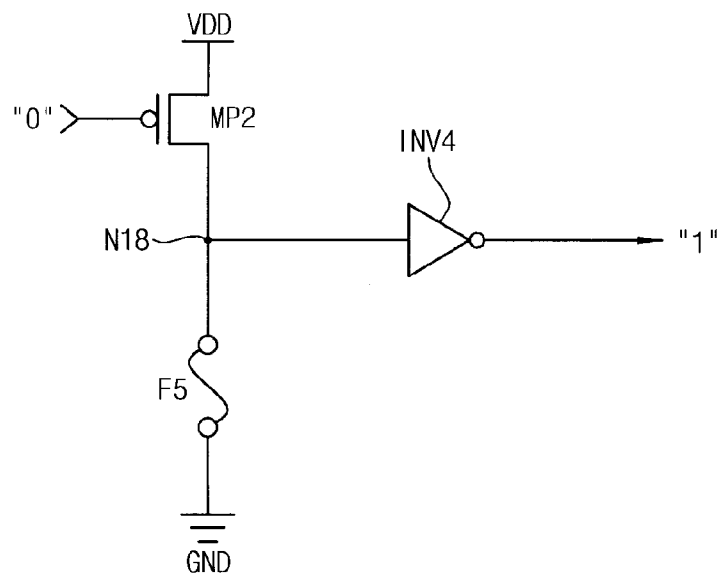

FIGS. 5A and 5B are circuit diagrams illustrating single-ended electrical fuse cells according to some example embodiments.

Referring to FIG. 5A, a single-ended electrical fuse cell may include a first p-type metal oxide semiconductor (PMOS) transistor MP1, a bit cell fuse F4, a second inverter INV2, and a third inverter INV3.

The first PMOS transistor MP1 includes a control terminal to which data corresponding to the logic state "0" is applied when the bit cell fuse F4 is required to be blown, a first terminal to which the power supply voltage VDD is applied, and a second terminal coupled to a seventh node N17. The bit cell fuse F4 is connected between the seventh node N17 and the ground voltage GND. The second inverter INV2 inverts a voltage of the seventh node N17 and the third inverter INV3 inverts an output voltage of the second inverter INV2 so that the third inverter INV3 outputs the data bit "0" which corresponds to one of the bits of the initial security key before the bit cell fuse F4 is not blown. When the data corresponding to the logic state "0" is applied to the control terminal of the first PMOS transistor MP1, the power supply voltage VDD is provided to the seventh node N17, and thus the bit cell fuse F4 is blown. The voltage of the seventh node N17 may correspond to a logic state "1" and the third inverter INV3 outputs the data bit "1" that may correspond to one bit of the changed security key.

Referring to FIG. 5B, a single-ended electrical fuse cell may include a second PMOS transistor MP2, a bit cell fuse F5, and a fourth inverter INV4.

The PMOS transistor MP2 includes a control terminal to which data corresponding to the logic state "0" is applied when the bit cell fuse F5 is required to be blown, a first terminal to which the power supply voltage VDD is applied, and a second terminal coupled to an eighth node N18. The bit cell fuse F5 is connected between the eighth node N18 and the ground voltage GND. The fourth inverter INV4 inverts a voltage of the eighth node N18 and outputs the data bit "1" which corresponds to one of the bits of the initial security key. When the initial security key is required to be changed after the fabrication of the integrated circuit including the single-ended fuse cell, the bit cell fuse F5 is blown in response to the power supply voltage VDD, and thus the fourth inverter INV4 may output the data bit "0" that may correspond to one bit of the changed security key.

Hereinafter, operations of the single-ended electrical fuse cells will be described with reference to FIGS. 5A and 5B.

With reference to FIG. 5A, when the bit cell fuse F4 is not blown, the voltage of the seventh node N17 corresponds to the logic state "low", and thus the single-ended electrical fuse cell outputs the data bit "0" which corresponds to one bit of the initial security key. When the bit cell fuse F4 is blown in response to the data corresponding to the logic state "0", the voltage of the seventh node N17 corresponds to the logic state "high", and thus the single-ended electrical fuse cell outputs the data bit "1". The bit cell fuse F4 is blown when the initial security key is required to be changed after the integrated circuit is fabricated so that the single-ended electrical fuse cell may output a corresponding bit of the changed security key.

With reference to FIG. 5B, when the bit cell fuse F5 is not blown, the voltage of the eighth node N18 corresponds to the logic state "low", and thus the single-ended electrical fuse cell outputs the data bit "1". When the bit cell fuse F5 is blown in response to the changed security key after the fabrication, the voltage of the eighth node N18 corresponds to the logic state "high", and thus the single-ended electrical fuse cell outputs the data bit "0". The bit value output from the single-ended electrical fuse cell is changed when the initial security key is required to be changed by blowing the bit cell fuse F5.

The single-ended electrical fuse cell illustrated in FIG. 5A outputs the data bit "0" when the bit fuse cell is not blown, and the single-ended electrical fuse cell illustrated in FIG. 5B outputs the data bit "1" when the bit fuse cell is not blown.

The electrical fuse ROM 120 in FIG. 3 may be implemented with a plurality of electrical fuse units that are arranged to correspond to bit values of an initial security key before the electrical fuse ROM 120 is programmed. For example, the plurality of electrical fuse units may include first electrical fuse units and second electrical fuse units such that each first electrical fuse unit outputs the data bit "0" before the electrical fuse ROM is programmed and each second electrical fuse unit outputs the data bit "1" before the electrical fuse ROM is programmed. FIGS. 4A and 5A illustrate examples of the first electrical fuse unit, and FIGS. 4B, 4C and 5B illustrate examples of the second electrical fuse unit. As mentioned above, the first electrical fuse units and the second electrical fuse units are arranged to correspond to the bit values of the initial security key, and such arrangement may be determined by an electrical fuse ROM compiler during a design phase of the integrated circuit including peripheral circuits and the security circuit.

Figure 6:
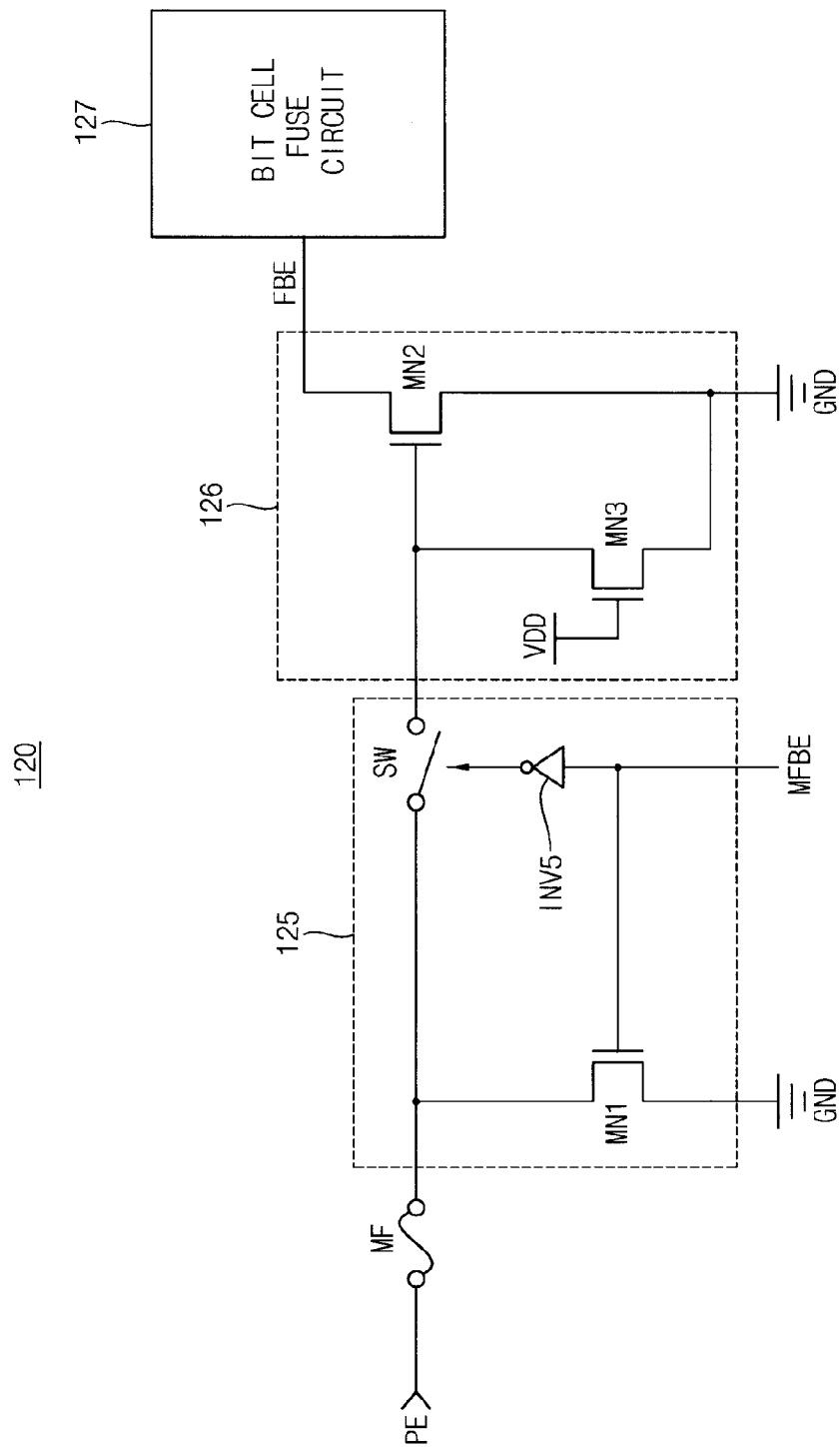
FIG. 6 is a circuit diagram illustrating an example of an electrical fuse unit included in the electrical fuse ROM in FIG. 3.

FIG. 6 is a circuit diagram illustrating an example embodiment of an electrical fuse unit included in the electrical fuse ROM in FIG. 3. An electrical fuse unit may be implemented in the electrical fuse ROM 120 in FIG. 3 according to the initial security key. The electrical fuse ROM 120 includes a plurality of the electrical fuse units each of which is arranged according to the determination of the electrical fuse ROM compiler 120 in FIG. 3 based on the initial security key in the design phase of the integrated circuit.

Referring to FIG. 6, the electrical fuse ROM 120 may include a master fuse MF, a master fuse blow circuit 125, a driver 126, and a bit cell fuse circuit 127.

The master fuse MF includes a first terminal to which a program enable signal PE is applied. The master fuse blow circuit 125 is coupled to a second terminal of the master fuse MF and blows the master fuse MF in response to a master fuse blow enable signal MFBE. The driver 126 generates a fuse blow enable signal FBE in response to an output signal of the master fuse blow circuit 125. The bit cell fuse circuit 127 is programmed in response to the fuse blow enable signal FBE and outputs the data bit "0" or the data bit "1".

The master fuse blow circuit 125 may include a first n-type MOS (NMOS) transistor MN1, an inverter INV5, and a switch SW.

The first NMOS transistor MN1 is connected between the second terminal of the master fuse MF and the ground voltage GND, and maintains a voltage of the second terminal of the master fuse MF at the ground voltage GND in response to the master fuse blow enable signal MFBE. The inverter INV5 inverts the master fuse blow enable signal MFBE. The switch SW includes a first terminal coupled to the second terminal of the master fuse MF and a second terminal coupled to the driver 126, and connects the master fuse blow circuit 125 and the driver 126 in response to an output signal of the inverter INV5.

The driver 126 may include a second NMOS transistor MN2 and a third NMOS transistor MN3.

The second NMOS transistor MN2 includes a control terminal to which an output signal of the master fuse blow circuit 125 is applied, a first terminal coupled to the ground voltage GND, and a second terminal to which the fuse blow enable signal FBE is applied. The third NMOS transistor MN3 includes a control terminal to which the power supply voltage VDD is applied, a first terminal coupled to the ground voltage GND, and a second terminal coupled to the control terminal of the second NMOS transistor.

Figure 7:
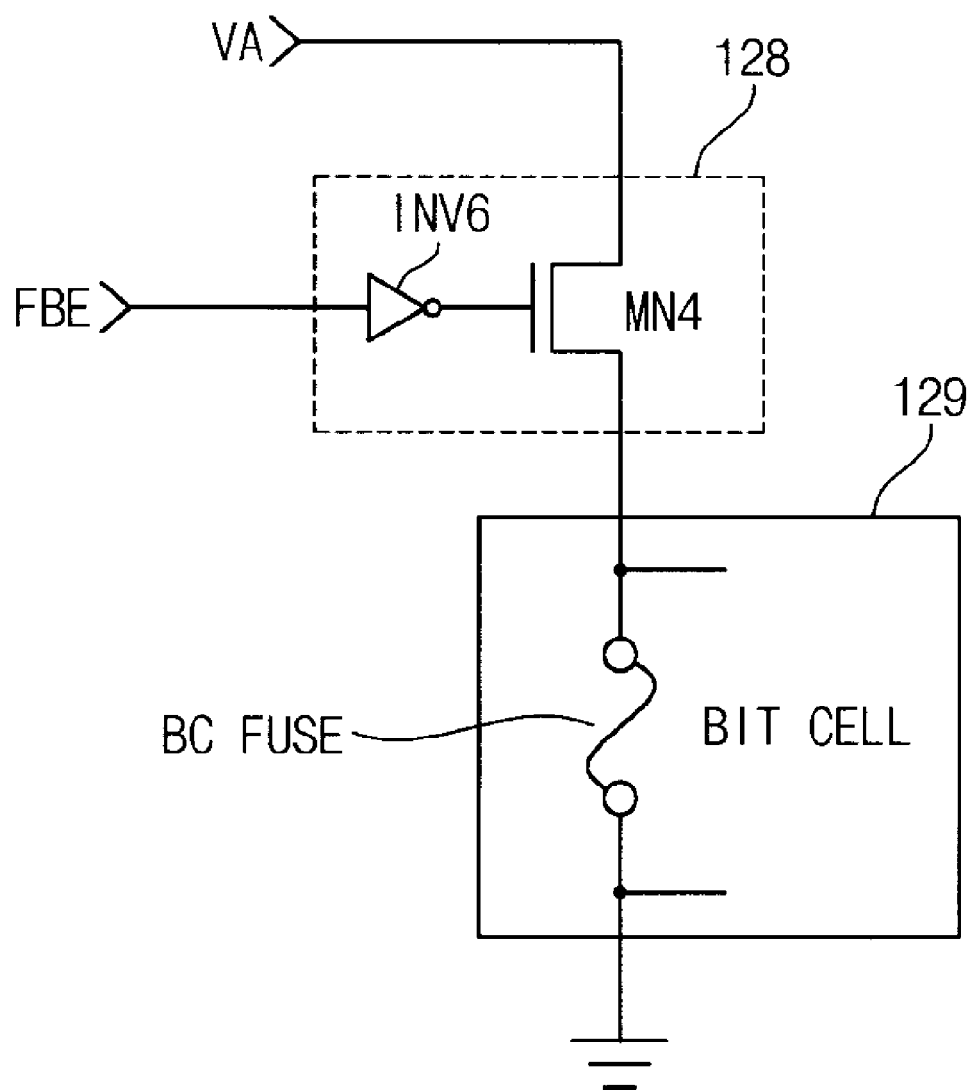
FIG. 7 is a circuit diagram illustrating an example of the bit cell fuse circuit included in the electrical fuse ROM of FIG. 6.

FIG. 7 is a circuit diagram illustrating an example embodiment of the bit cell fuse circuit included in the electrical fuse ROM of FIG. 6.

Referring to FIG. 7, a bit cell fuse circuit 127 may include a blow unit 128, and a bit cell 129 including a bit cell fuse BC FUSE. The blow unit 128 may include an inverter INV6 and an NMOS transistor MN4. The inverter INV6 inverts the fuse blow enable signal FBE. The NMOS transistor MN4 includes a control terminal to which an output signal of the inverter INV6 is applied, a first terminal coupled to the bit cell fuse BC FUSE, and a second terminal to which the high voltage VA is applied.

Hereinafter, operation of the each electrical fuse unit included in the electrical fuse ROM 120 will be described with reference to FIGS. 6 and 7.

Referring to FIG. 7, the bit cell fuse circuit 127 may include the blow unit 128 and the bit cell 129. The bit cell 129 may be one of the electrical fuse cells of FIGS. 4A through 5B. The blow unit 128 blows the bit cell fuse BC FUSE included in the bit cell 129 in response to the fuse blow enable signal FBE. For example, when the power supply voltage VDD corresponds to 1.2V, the high voltage VA applied to the second terminal of the NMOS transistor MN4 may corresponds to 2.5V to 3.5V to blow the bit cell fuse BC FUSE.

In FIG. 6, the master fuse MF may prevent unwanted changes of the initial security key through a package pin. When the master fuse MF is blown, the bit cell fuse circuit 127 is not able to be programmed after the fabrication of the integrated circuit. When the program enable signal PE corresponds to the logic state "high" and the master fuse blow enable signal MFBE corresponds to the logic state "high", the switch SW is open and the first NMOS transistor MN1 is turned on. Therefore, the master fuse MF is blown and a voltage of a first terminal of the first NMOS transistor MN1 corresponds to the ground voltage GND, and thus the bit cell fuse circuit 127 may not be programmed by the program enable signal PE.

When the program enable signal PE corresponds to the logic state "high" and the master fuse blow enable signal MFBE corresponds to the logic state "low", the switch SW is closed, and then a signal corresponding to the logic state "high" may be applied to the control terminal of the second NMOS transistor MN2 in the driver 126. The second NMOS transistor MN2 is turned on, and thus the fuse blow enable signal FBE corresponds to the logic state "low". When the fuse blow enable signal FBE corresponds to the logic state "low", the NMOS transistor MN4 included in the blow unit 128 in FIG. 7 is turned on, and thus the high voltage VA is applied to the bit cell fuse BC FUSE so that the bit cell fuse BC FUSE is blown.

When the program enable signal PE corresponds to the logic state "low" and the master fuse blow enable signal MFBE corresponds to the logic state "low", the switch SW is closed, and then a signal corresponding to the logic state "low" may be applied to the control terminal of the second NMOS transistor MN2 in the driver 126. The second NMOS transistor MN2 is turned off, and thus a node between the second terminal of the second NMOS transistor MN2 and the bit cell fuse circuit 127 is floated. The NMOS transistor MN4 is turned off because the fuse blow enable signal FBE corresponding to a voltage of the floated node is applied to the control terminal of the NMOS transistor MN4. Therefore, the high voltage VA is not applied to the bit cell fuse BC FUSE, and thus the bit cell fuse BC FUSE is not blown.

The third NMOS transistor MN3 included in the driver 126 quickly turns off the second NMOS transistor MN2 when the signal corresponding to the logic state "low" is applied to the control terminal of the second NMOS transistor MN2. Therefore, it is preferred that the third NMOS transistor MN3 be smaller than the second NMOS transistor.

As described above, the security circuits according to some example embodiments may be implemented with the electrical fuse units designed based on the initial security key during the design phase of the integrated circuit and prevent the unwanted changes of the initial security key through the package pins.

The security circuit may be applicable to semiconductor devices such as an embedded dynamic random access memory (eDRAM) implementing a system on a chip (SoC).

While the example embodiments of the present invention and their advantages have been described in detail, it should be understood that various changes, substitutions and alternations may be made without departing from the scope of the invention.

What is claimed is:

1. A system on chip (SoC) comprising:
a memory including a plurality of bit cells arranged to correspond to bit values of a first security key, each of the plurality of bit cells comprising an electrical fuse, wherein the plurality of bit cells are configured to output data bits corresponding to the first security key and the plurality of bit cells are configured to be programmed using the electrical fuses to output data bits corresponding to a second security key,
wherein the memory of the SoC further includes a plurality of electrical fuse units corresponding to the respective bit cells each electrical fuse unit including:
a master fuse including a first terminal to which a program enable signal is applied;
a master fuse blow circuit coupled to a second terminal of the master fuse, the master fuse blow circuit being configured to blow the master fuse in response to a master fuse blow enable signal;
a driver configured to generate a fuse blow enable signal in response to an output signal of the master fuse blow circuit; and
a bit cell fuse circuit configured to program a corresponding bit cell of the plurality of bit cells in response to the fuse blow enable signal.

2. The SoC of claim 1, wherein the plurality of bit cells output the data bits corresponding to the first security key before the electrical fuses are blown, and wherein the plurality of bit cells output the data bits corresponding to the second security key, if the electrical fuses are blown in response to the second security key.

3. The SoC of claim 1, wherein the plurality of bit cells are programmed in response to the second security key after the SoC is fabricated when the first security key is required to be changed into the second security key.

4. The SoC of claim 1, wherein the plurality of bit cells comprise:
first bit cells, each first bit cell outputting a data bit "0" before the memory is programmed in response to the second security key; and
second bit cells, each second bit cell outputting a data bit "1" before the memory is programmed in response to the second security key.

5. The SoC of claim 4, wherein the first bit cells and the second bit cells are arranged to correspond to bit values of the first security key.

6. The SoC of claim 1, wherein each electrical fuse is blown in response to a corresponding bit of the second security key, after the SoC is fabricated when the first security key is required to be changed into the second security key.

7. The SoC of claim 1, wherein the master fuse blow circuit comprises:
a metal oxide semiconductor (MOS) transistor connected between the second terminal of the master fuse and a ground voltage, the MOS transistor being configured to maintain a voltage level of the second terminal of the master fuse at the ground voltage in response to the master fuse blow enable signal;
an inverter configured to invert the master fuse blow enable signal; and
a switch including a first terminal coupled to the second terminal of the master fuse and a second terminal coupled to the driver, the switch being configured to connect the second terminal of the master fuse to the driver in response to an output signal of the inverter.

8. The SoC of claim 1, wherein the driver comprises:
a first MOS transistor including a control terminal to which an output signal of the master fuse blow circuit is applied, a first terminal coupled to a ground voltage, and a second terminal configured to output the fuse blow enable signal; and
a second MOS transistor including a control terminal to which a power supply voltage is applied, a first terminal coupled to the ground voltage, and a second terminal coupled to the control terminal of the first MOS transistor.

9. The SoC of claim 1, wherein the bit cell fuse circuit blows the electrical fuse of the corresponding bit cell.

10. The SoC of claim 1, wherein the bit cell fuse circuit comprises:
a blow unit configured to provide a high voltage to the corresponding bit cell in response to the fuse blow enable signal to blow the electrical fuse of the corresponding bit cell.

11. The SoC of claim 10, wherein the blow unit comprises:
an inverter configured to invert the fuse blow enable signal; and
an n-type MOS (NMOS) transistor including a control terminal to which an output signal of the inverter is applied, a first terminal coupled to the electrical fuse of the corresponding bit cell, and a second terminal to which the high voltage is applied.

12. A system on chip (SoC) comprising:
a memory including a plurality of bit cells arranged to correspond to bit values of a first security key, each of the plurality of bit cells comprising an electrical fuse, wherein the plurality of bit cells are configured to output data bits corresponding to the first security key and the plurality of bit cells are configured to be programmed using the electrical fuses to output data bits corresponding to a second security key, wherein each bit cell of the memory of the SoC further comprises:
a first resistor including a first terminal coupled to a power supply voltage;
a second resistor connected between a ground voltage and a second terminal of the first resistor, the electrical fuse of the bit cell being connected between the ground voltage and a first node;
a third resistor connected between the first node and the power supply voltage; and
a sense amplifier including an inverted terminal coupled to the second terminal of the first resistor and a non-inverted terminal coupled to the first node, the sense amplifier being configured to amplify a voltage difference between voltages of the inverted terminal and the non-inverted terminal, and to output a data bit "0" which corresponds to one bit of the first security key before the electrical fuse of the bit cell is blown.

13. The SoC of claim 12, wherein each bit cell further comprises:
an inverter configured to invert an output signal of the sense amplifier, and to output a data bit "1" which corresponds to one bit of the first security key before the electrical fuse is blown.

14. A system on chip (SoC) comprising:
a memory including a plurality of bit cells arranged to correspond to bit values of a first security key, each of the plurality of bit cells comprising an electrical fuse, wherein the plurality of bit cells are configured to output data bits corresponding to the first security key and the plurality of bit cells are configured to be programmed using the electrical fuses to output data bits corresponding to a second security key, wherein each bit cell of the memory of the SoC further comprises:
a first resistor connected between a power supply voltage and a first terminal of the electrical fuse of the bit cell, the electrical fuse including the first terminal and a second terminal coupled to a ground voltage;
a second resistor connected between the ground voltage and a first node;
a third resistor connected between the first node and the power supply voltage; and
a sense amplifier including an inverted terminal coupled to the second terminal of the electrical fuse and a non-inverted terminal coupled to the first node, the sense amplifier being configured to amplify a voltage difference between voltages of the inverted terminal and the non-inverted terminal, and to output a data bit "1" which corresponds to one bit of the first security key before the electrical fuse is blown.

15. A system on chip (SoC) comprising:
a memory including a plurality of bit cells arranged to correspond to bit values of a first security key, each of the plurality of bit cells comprising an electrical fuse, wherein the plurality of bit cells are configured to output data bits corresponding to the first security key and the plurality of bit cells are configured to be programmed using the electrical fuses to output data bits corresponding to a second security key, wherein each bit cell of the memory of the SoC further comprises:
a PMOS transistor including a control terminal to which data corresponding to a logic state "0" is applied, a first terminal to which a power supply voltage is applied, and a second terminal coupled to a first node, the electrical fuse of the bit cell being connected between the first node and a ground voltage; and
an inverter configured to invert a voltage of the first node, and to output a data bit "0" which corresponds to one of the first security key before the electrical fuse is blown.

16. The SoC of claim 15, wherein the inverter comprises:
a first inverter configured to invert a voltage of the first node; and
a second inverter configured to invert an output voltage of the first inverter, and to output a data bit "0" which corresponds to one bit of the first security key before the electrical fuse is blown.

17. A system on chip (SoC) comprising:
a security circuit, comprising:
an electrical fuse read only memory (ROM) including a plurality of electrical fuse units that are arranged to correspond to bit values of an initial security key before the electrical fuse ROM is programmed;
wherein the electrical fuse ROM is programmed in response to a changed security key after the SoC including the security circuit is fabricated when the initial security key is required to be changed,
wherein each electrical fuse unit comprises:
a master fuse including a first terminal to which a program enable signal is applied;
a master fuse blow circuit coupled to a second terminal of the master fuse, the master fuse blow circuit being configured to blow the master fuse in response to a master fuse blow enable signal;
a driver configured to generate a fuse blow enable signal in response to an output signal of the master fuse blow circuit; and
a bit cell fuse circuit configured to be programmed in response to the fuse blow enable signal.

18. The SoC of claim 17, wherein the arrangement of the plurality of electrical fuse units is determined by an electrical fuse ROM compiler during a design phase of the SoC including peripheral circuits and the security circuit, the electrical fuse ROM compiler being configured to arrange the peripheral circuits and the plurality of electrical fuse units.

19. The SoC of claim 17, wherein the master fuse blow circuit comprises:

a metal oxide semiconductor (MOS) transistor connected between the second terminal of the master fuse and a ground voltage, the MOS transistor being configured to maintain a voltage level of the second terminal of the master fuse at the ground voltage in response to the master fuse blow enable signal;

an inverter configured to invert the master fuse blow enable signal; and a switch including a first terminal coupled to the second terminal of the master fuse and a second terminal coupled to the driver, the switch being configured to connect the second terminal of the master fuse to the driver in response to an output signal of the inverter.

20. The SoC of claim 17, wherein the bit cell fuse circuit comprises:

a bit cell including a bit cell fuse; and a blow unit configured to provide a high voltage to the bit cell in response to the fuse blow enable signal to blow the bit cell fuse.

* * * * *